ns549B2

United States Patent
Blietz et al.

(10) Patent No.: US 7,820,549 B2
(45) Date of Patent: Oct. 26, 2010

(54) LAYERED SEMICONDUCTOR WAFER WITH LOW WARP AND BOW, AND PROCESS FOR PRODUCING IT

(75) Inventors: Markus Blietz, Tittmoning (DE); Robert Hoelzl, Postmuenster (DE); Reinhold Wahlich, Tittmoning (DE); Andreas Huber, Garching (DE)

(73) Assignee: Siltronic AG, Munich (DE)

( * ) Notice: Subject to any disclaimer, the term of this patent is extended or adjusted under 35 U.S.C. 154(b) by 453 days.

(21) Appl. No.: 12/023,102

(22) Filed: Jan. 31, 2008

(65) Prior Publication Data

US 2008/0122043 A1    May 29, 2008

Related U.S. Application Data

(62) Division of application No. 11/206,599, filed on Aug. 18, 2005, now abandoned.

(30) Foreign Application Priority Data

Aug. 26, 2004    (DE) ........................ 10 2004 041 378

(51) Int. Cl.
    *H01L 21/20* (2006.01)
(52) U.S. Cl. ........................................ 438/689
(58) Field of Classification Search ........................ None
    See application file for complete search history.

(56) References Cited

U.S. PATENT DOCUMENTS

| 5,374,564 | A | 12/1994 | Bruel |
| 6,342,725 | B2 * | 1/2002 | Falster ........................ 257/618 |
| 6,743,495 | B2 | 6/2004 | Vasat et al. |
| 2001/0007240 | A1 | 7/2001 | Dietze et al. |
| 2003/0054641 | A1 * | 3/2003 | Binns et al. ................. 438/689 |
| 2003/0136961 | A1 | 7/2003 | Mule'Stagno et al. |
| 2004/0023443 | A1 | 2/2004 | Kim et al. |
| 2004/0142542 | A1 | 7/2004 | Murphy et al. |

FOREIGN PATENT DOCUMENTS

EP    533 551 A1    3/1993

(Continued)

OTHER PUBLICATIONS

A. Giannattasio, S. Senkader, S. Azam, R.J. Falster, P.R. Wilshaw: "The Use Of Numerical Simulation To Predict The Unlocking Stress Of Dislocations in CZ-silicon Wafers," Microelectronic Engineering 70 (2003) pp. 125-130.

(Continued)

*Primary Examiner*—Charles D Garber
*Assistant Examiner*—Andre' C Stevenson
(74) *Attorney, Agent, or Firm*—Brooks Kushman P.C.

(57) ABSTRACT

Semiconductor wafers with a diameter of at least 200 mm comprise a silicon carrier wafer, an electrically insulating layer and a semiconductor layer located thereon, the semiconductor wafer having been produced by means of a layer transfer process comprising at least one RTA step, wherein the semiconductor wafer has a warp of less than 30 µm, a DeltaWarp of less than 30 µm, a bow of less than 10 µm and a DeltaBow of less than 10 µm. Processes for the production of a semiconductor wafer of this type require specific heat treatment regimens.

20 Claims, 3 Drawing Sheets

FOREIGN PATENT DOCUMENTS

| | | |
|---|---|---|
| EP | 1 158 581 A1 | 11/2001 |
| JP | 07-169925 | 4/1995 |
| JP | 09-326396 A | 12/1997 |
| JP | 11-330437 | 11/1999 |
| JP | 2003-297839 | 10/2003 |
| JP | 2004-111732 | 8/2004 |
| WO | 98/52216 A1 | 11/1998 |
| WO | 03/003430 A2 | 1/2003 |

OTHER PUBLICATIONS

K. Jurkschat, S. Senkader, P.R. Wilshaw, D. Gambaro, R.J. Falster: "Onset Of Slip In Silicon Containing Oxide Precipitates," J. Appl. Phys. vol. 90, No. 7 (2001), pp. 3219-3225.

* cited by examiner

LAYERED SEMICONDUCTOR WAFER WITH LOW WARP AND BOW, AND PROCESS FOR PRODUCING IT

This is a divisional application of U.S. patent application Ser. No. 11/206,599 filed Aug. 18, 2005, now abandoned and also claims priority to that application and to German Application DE 10 2004 041 378.9 filed Aug. 26, 2004.

BACKGROUND OF THE INVENTION

1. Field of the Invention

The invention relates to a semiconductor wafer with a diameter of at least 200 mm produced by a layer transfer process including at least one RTA step, and comprising a carrier wafer of silicon, an electrically insulating layer, and a semiconductor layer located thereon, the semiconductor wafer having low warp and bow, both in the unprocessed state and after any desired component fabrication process. Moreover, the invention relates to a process for producing such wafers.

2. Background Art

SOI (silicon on insulator) wafers are generally produced by transferring a silicon layer from a donor wafer to a carrier wafer, also known as a handle wafer or a base wafer. Processes for producing SOI wafers by transferring a silicon layer (layer transfer) are described, for example, in EP533551A1, WO98/52216A1, and WO03/003430A2. SOI wafers comprise a carrier wafer and a single-crystal silicon covering layer, also known as top layer or device layer, joined thereto. The silicon covering layer represents what is generally described as the active layer intended for the fabrication of electronic components. It is joined to the carrier wafer, which generally also consists of single-crystal silicon, via an electrically insulating intermediate layer, for example one of silicon oxide. In this context, the intermediate layer may be referred to as a buried oxide layer, or "BOX". The carrier wafer is usually a polished silicon wafer, generally obtained from single crystal silicon produced by means of the Czochralski crystal pulling process (CZ process). Wafers of this type are referred to below as CZ silicon wafers.

The donor wafers used are typically so-called "perfect" or "ultimate" silicon wafers, in order to ensure a low defect density. SOI wafers of this type are in particular used as starting material for the fabrication of advanced integrated circuits (advanced ICs), for which in particular, high switching speeds and low power consumption are important. To reduce the surface roughness, it is customary for the SOI wafer to be subjected to a heat treatment, for example an RTA (rapid thermal anneal) treatment. Processes are also known, cf. for example EP1158581A1, in which the SOI wafer is subjected firstly to an RTA treatment and then to a further heat treatment in what is known as a batch furnace. A large number of SOI wafers mounted parallel to one another are heat-treated simultaneously in a batch furnace.

However, SOI wafers which are produced by this process have the drawback of being deformed during this heat treatment, as well as during subsequent heat treatments associated with the fabrication of electronic components. This deformation can lead to serious complications in the fabrication of electronic components. For example, during photolithography, the SOI wafer which is to be exposed is secured in place employing a vacuum wafer holder in order to provide a surface which is as planar as possible during exposure. This procedure is intended to ensure that the imaging of the mask pattern on the SOI wafer is as accurate as possible. If the wafer is deformed, it cannot be completely "sucked" onto the vacuum wafer holder, with the result that the surface is not planar during exposure. In this case, sharply defined imaging of the mask pattern on the surface is not possible in all regions of the SOI wafer. Moreover, this can lead to a lateral offset in the mask pattern transferred to the SOI wafer, with the result that adjacent components overlap and therefore cannot function.

The parameter which best describes the deformation of the SOI wafer and which is highly important for the photolithography is the global shape. The global shape of a wafer is described below by the two parameters "warp" and "bow". The term warp is to be understood as meaning the maximum deviation between any location on the SOI wafer and a plane passing through the center of gravity of the SOI wafer mounted free of forces. An accurate definition of this parameter is to be found in standard ASTM F1390. The term bow is to be understood as meaning the maximum deviation between any location on the SOI wafer mounted free of forces and a plane which is defined by three points on the wafer forming an isosceles triangle. The bow parameter is defined in standard ASTM F534. The bow is generally included in the warp and cannot be greater than the warp.

During the fabrication of electronic components comprising the application of complicated layer structures with the aid of a large number of heat treatment steps, deformation occurs for two reasons, manifesting itself in a deterioration in the warp and bow parameters: firstly, the layer structure of the SOI wafers e.g. silicon carrier wafer, insulating layer of silicon oxide, silicon layer, which inevitably entails certain stresses, leads to the increased formation of warp and bow. SOI wafers produced by the process described above additionally reveal a change in their plastic properties during component fabrication, which is caused by the formation and growth of oxygen precipitates (referred to below as BMDs, i.e. bulk microdefects) in the carrier wafer. This change in the plastic properties in turn leads to an increase in warp and bow. This effect is described, albeit for the significantly simpler case of silicon wafers (i.e. without a layer structure), for example in A. Giannattasio, S. Senkader, S. Azam, R. J. Falster, P. R. Wilshaw: "*The Use Of Numerical Simulation To Predict The Unlocking Stress Of Dislocations In CZ-silicon Wafers*," MICROELECTRONIC ENGINEERING 70 (2003), pp. 125-130, and K. Jurkschat, S. Senkader, P. R. Wilshaw, D. Gambaro, R. J. Falster: "*Onset Of Slip In Silicon Containing Oxide Precipitates*," J. APPL. PHYS. Vol. 90, No. 7 (2001), pp. 3219-3225. Those documents explain the relationship between interstitial oxygen concentration and the slippage mobility: the higher the interstitial oxygen concentration, the more resistant the silicon wafer becomes to deformation. The interstitial oxygen concentration can thereby be significantly influenced by the oxygen precipitation.

In the text which follows, this additional deformation of the SOI wafer in the component fabrication process, which is caused solely by a change in the plastic properties of the SOI wafer, is referred to as DeltaWarp or DeltaBow. To avoid problems in photolithography and associated losses of yield, both the warp and bow values of the SOI wafer prior to component fabrication and the DeltaWarp and DeltaBow in the component process have to be minimized. However, the prior art RTC processes failed to produce wafers which have low initial deformation. During subsequent device fabrication, deformation noticeably increases. It would thus be desirable to provide an SOI wafer with a low initial deformation, and one in which subsequent processing does not cause significant additional deformation in terms of warp and bow.

SUMMARY OF THE INVENTION

The present invention provides a semiconductor wafer with a diameter of at least 200 mm, comprising a carrier wafer consisting of silicon, an electrically insulating layer and a semiconductor layer located thereon, the semiconductor wafer having been produced by means of a layer transfer process comprising at least one RTA step, wherein the semiconductor wafer has a warp of less than 30 µm, a DeltaWarp of less than 30 µm, a bow of less than 10 µm and a DeltaBow of less than 10 µm. It is preferable for the carrier wafer of this semiconductor wafer to have a BMD density in the range from $1 \cdot 10^3/cm^2$ to $1 \cdot 10^6/cm^2$, and thus the present invention also provides a semiconductor wafer having a warp of less than 30 µm and a bow of less than 10 µm, and wherein the carrier wafer has a BMD density in the range from $1 \cdot 10^3/cm^2$ to $1 \cdot 10^6/cm^2$.

The present invention further provides a process for producing SOI wafers which meet the above criteria, wherein the layer transfer process involves one or more RTA treatments at defined temperature(s) and cooling ramps.

DETAILED DESCRIPTION OF THE PREFERRED EMBODIMENT(S)

On account of its low warp and bow values in the starting state and the low DeltaWarp and DeltaBow values after the heat treatment in the component process, a semiconductor wafer according to the invention leads to a significantly wider process window for photolithography and to a significantly higher overall yield in component fabrication. It is preferable for the warp of the semiconductor wafer according to the invention to be less than 20 µm and for the bow to be less than 5 µm. Furthermore, the DeltaWarp value of the semiconductor wafer according to the invention after the fabrication of electronic components is preferably less than 20 µm. The DeltaBow value is preferably less than 5 µm. The BMD density of the carrier wafer of the semiconductor wafer according to the invention is particularly preferably in the range from $1 \cdot 10^3/cm^2$ to $1 \cdot 10^5/cm^2$. Moreover, a BMD density which is as homogeneous as possible is preferred, in particular a BMD density which throughout the entire volume of the carrier wafer deviates by no more than 50% from the mean BMD density throughout the volume of the carrier wafer.

The carrier wafer of the semiconductor wafer according to the invention preferably has a specific resistivity in the range from 1 to 1000 Ωcm.

Preferably, the carrier wafer of the semiconductor wafer according to the invention has an interstitial oxygen concentration in the range from $3 \cdot 10^{17}/cm^3$ to $8 \cdot 10^{17}/cm^3$ and a nitrogen concentration in the range from $1 \cdot 10^{13}/cm^3$ to $5 \cdot 10^{15}/cm^3$. It is particularly preferable to use an interstitial oxygen concentration in the range from $5 \cdot 10^{17}/cm^3$ to $7 \cdot 10^{17}/cm^3$ in combination with a nitrogen concentration in the range from $1 \cdot 10^{13}/cm^3$ to $5 \cdot 10^{15}/cm^3$, an interstitial oxygen concentration in the range from $3 \cdot 10^{17}/cm^3$ to $8 \cdot 10^{17}/cm^3$ in combination with a nitrogen concentration in the range from $5 \cdot 10^{14}/cm^3$ to $5 \cdot 10^{15}/cm^3$ and an interstitial oxygen concentration in the range from $3 \cdot 10^{17}/cm^3$ to $5 \cdot 10^{17}/cm^3$ in combination with a nitrogen concentration in the range from $5 \cdot 10^{14}/cm^3$ to $5 \cdot 10^{15}/cm^3$.

The present invention encompasses all types of semiconductor wafers which include a carrier wafer made from silicon, an electrically insulating layer and any semiconductor layer located thereon, these wafers having been produced by means of layer transfer with at least one RTA step. The electrically insulating layer preferably consists of silicon oxide, but may also consist of other suitable insulators. The semiconductor layer consists of semiconducting material, preferably of single-crystal silicon. In this context, it is only possible to refer to a carrier wafer if the semiconductor wafer is produced by transfer of a thin film of silicon from a donor wafer to another wafer, the carrier wafer. SOI wafers which are produced by the known SIMOX process, i.e. by implantation of oxygen ions and subsequent heat treatment, without a layer being transferred to a carrier wafer, are not carrier wafers in the sense of the invention and are therefore not within the scope of the invention.

A semiconductor wafer according to the invention can be produced by the processes described below. Each process requires a defined thermal treatment regimen.

The first process according to the invention comprises a heat treatment of the semiconductor wafer, in which the semiconductor wafer is heated at a heating rate of from 10 to 200° C./s until the temperature has reached a value in the range from 1,100 to 1,250° C., is then held in this temperature range for a period of 5 s to 300 s, and is then cooled at a cooling rate of from 0.5 to 25° C./s. The cooling rate is preferably in the range from 0.5 to 15° C.

The second process according to the invention comprises a heat treatment of the semiconductor wafer, in which the semiconductor wafer is heated at a heating rate of from 10 to 200° C./s until the temperature has reached a value in a first range of from 1,100 to 1,250° C., is held in this first temperature range for a first period of 5 s to 300 s, is then cooled at a first cooling rate of from 10 to 150° C./s until the temperature is in a second range from 1,000 to 1,150° C., is held in the second temperature range for a second period of from 10 s to 300 s, and is subsequently further cooled at a second cooling rate of from 10 to 150° C./s.

The third process according to the invention comprises a first heat treatment of the semiconductor wafer, in which the semiconductor wafer is heated at a first heating rate of from 10 to 200° C./s until the temperature has reached a value in a first range of from 1,100 to 1,250° C., is held in this first temperature range for a first period of 5 s to 300 s, and is subsequently cooled at a first cooling rate of from 10 to 150° C./s, and a second heat treatment of the semiconductor wafer, in which the semiconductor wafer is heated at a second heating rate of from 10 to 200° C./s until the temperature has reached a value in a second range of from 1,000 to 1,150° C., is then held in the second temperature range for a second period of 10 s to 300 s, and is subsequently cooled at a second cooling rate of from 10 to 150° C./s.

In both the second and third inventive processes, the duration of the second thermal treatment period is preferably in the range from 30 s to 120 s.

The fourth process according to the invention comprises a heat treatment of the semiconductor wafer under an atmosphere which contains more than 12,000 ppm of oxygen, in which the semiconductor wafer is heated at a heating rate of from 10 to 200° C. until the temperature has reached a value in the range from 1,100 to 1,250° C., is then held in this temperature range for a period of 5 s to 300 s, and is then cooled at a cooling rate of from 10 to 150° C./s.

The atmosphere in the fourth process according to the invention preferably contains a noble gas or a mixture of a plurality of noble gases in addition to oxygen. A preferred noble gas is argon. An oxygen content of at least 20,000 ppm is preferred.

All the processes according to the invention are based on the use of a suitably modified heat treatment, more specifically an RTA treatment as part of the production of the semiconductor wafer according to the invention. In the context of the invention, an RTA treatment is to be understood as meaning a rapid thermal treatment. The RTA treatment is not restricted to being carried out in any specific apparatus. By way of example, it is possible to use a lamp furnace or an epitaxy reactor or another suitable apparatus allowing the required high heating and cooling rates. The heat treatment can take place under an atmosphere which contains one or more of the following gases: nitrogen, oxygen, hydrogen and compounds of these elements with one another, noble gases (e.g. argon), silanes or chlorosilanes. In the fourth process according to the invention, however, the atmosphere must include the required oxygen content. Moreover, the heat treatment can be carried out under various gas pressures, e.g. subatmospheric pressure, atmospheric pressure or superatmospheric pressure. A subsequent heat treatment in a batch furnace as described in EP1158581A1, is not required.

All the processes according to the invention lead to a reduction in the BMD density and to an unexpected and surprising change in the BMD depth profile. This altered BMD density and depth profile makes the semiconductor wafer more resistant to the formation of bow and warp in thermal processes, whether in the process of producing the semiconductor wafer itself or in the subsequent component process.

The four processes according to the invention can also be combined in various ways.

The inventive change in the heat treatment of the semiconductor wafer, for example an SOI wafer results in significantly reduced values for warp and bow, both for the semiconductor wafer immediately after it has been produced and also during and after the fabrication of electronic components. DeltaWarp and DeltaBow are therefore likewise considerably reduced. In particular, the process according to the invention allows values of less than 30 μm, preferably less than 20 μm, to be achieved for the warp and values of less than 10 μm, preferably less than 5 μm, to be achieved for the bow. Values of less than 30 μm, preferably less than 20 μm, are likewise achieved for DeltaWarp, and values of less than 10 μm, preferably less than 5 μm, are likewise achieved for DeltaBow. This means that there is only a slight deformation of the wafer during the fabrication of electronic components.

A fracture edge analysis of the semiconductor wafers for BMDs (cf. FIG. 1) reveals that the heat treatment according to the invention has a significant influence on the BMD density of the carrier wafer. With the heat treatment in accordance with EP1158581A1, BMD densities of up to more than $1 \cdot 10^6$/cm$^2$ are found. Moreover, the BMD density of the carrier wafer is higher by a multiple in the vicinity of the wafer front surface 1 than in the vicinity of the wafer back surface 3. By contrast, with the heat treatment according to the invention, relatively homogeneous BMD densities of less than $1 \cdot 10^6$/cm$^2$, preferably less than $1 \cdot 10^5$/cm$^2$, are achieved. The BMD density of the semiconductor wafers according to the invention preferably deviates by no more than 50% from a mean value formed throughout the entire volume of the carrier wafer.

The reduction in the BMD density has a positive influence on the plastic properties. This is attributable to an increase in the interstitial oxygen concentration. Moreover, the heat treatment according to the invention alters the homogeneity of the BMD density, which has a beneficial effect on the layer stress in the SOI wafer. When considered in combination, the effects lead to the described reduction in bow and warp, whether immediately after the SOI process or during a heat treatment involved in component fabrication. This allows the photolithography problems described to be solved.

Another advantage of the invention is that the required changes to the heat treatment of the SOI wafer are simple to implement and have no harmful side effects on other important parameters of the finished SOI wafer.

The prior art has not disclosed a valid model which takes into account all the variables influencing the mechanical properties, in particular the deformation resistance of silicon wafers, simultaneously. This applies to an even greater extent in particular to semiconductor wafers with a layer structure which are produced by transferring a silicon layer and comprise a carrier wafer, an electrically insulating layer and a semiconductor layer.

Figure 1:
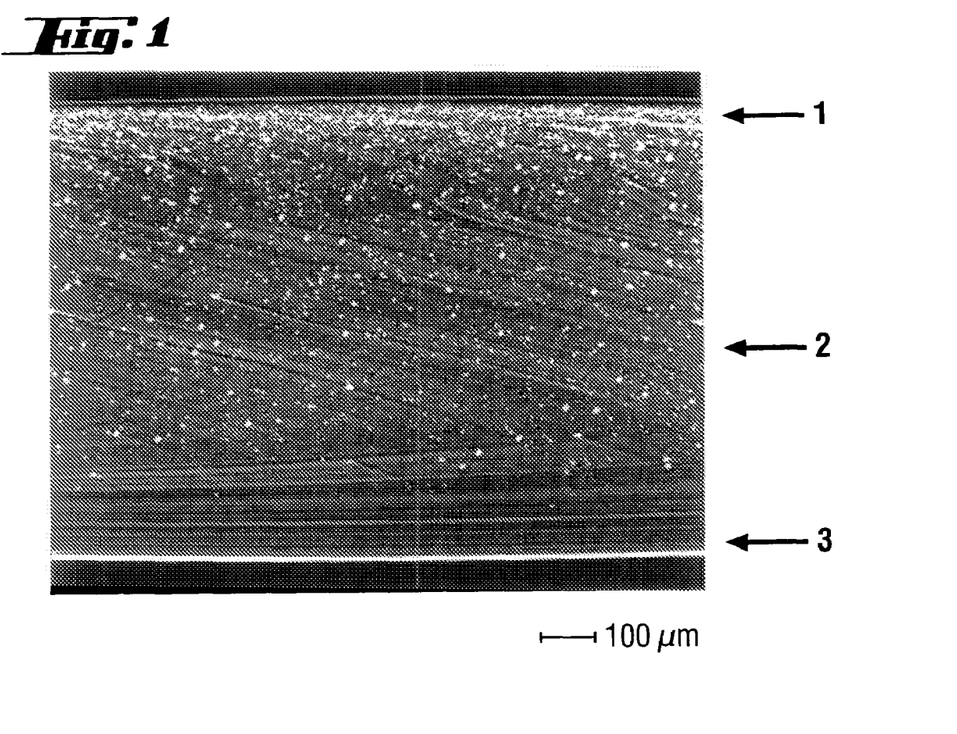
FIG. 1 shows the typical inhomogeneous BMD distribution in an SOI wafer produced by transfer of a silicon layer and heat treatment as described in EP1158581A1.
Figure 2:
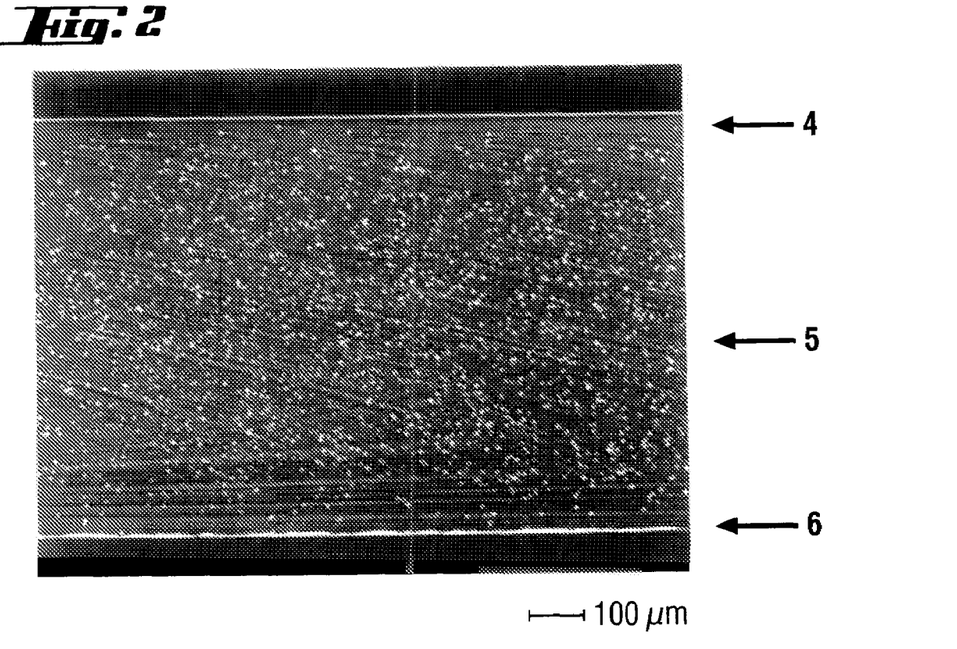
FIG. 2 for comparison, shows the different and extensively homogeneous BMD distribution in a conventional, polished CZ silicon wafer.
Figure 3:
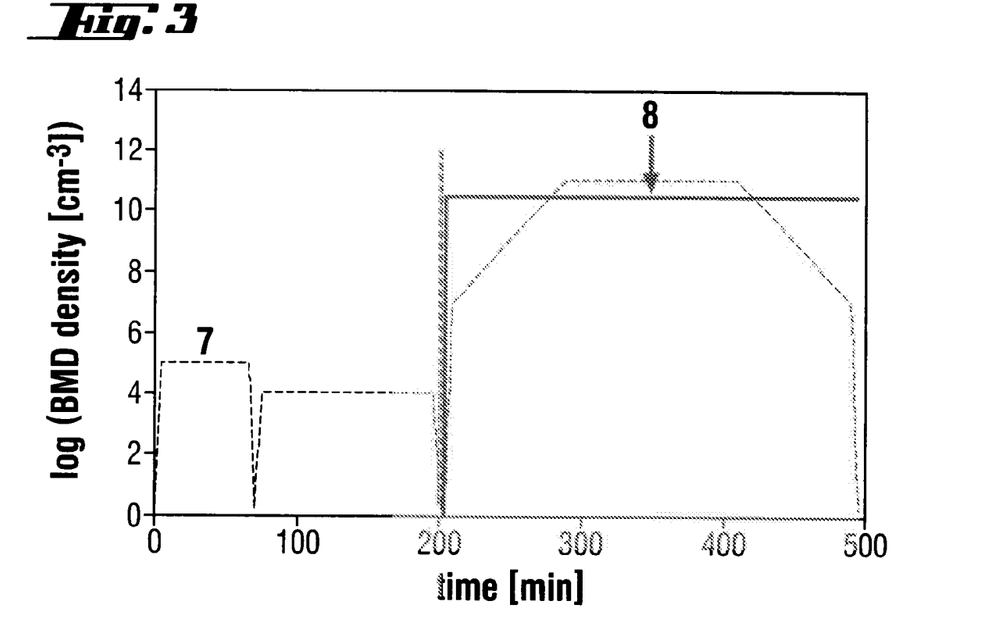
FIG. 3 shows all the heat treatments which take place during the production of the SOI wafer in accordance with EP1158581A1 and the development of the concentration of the interstititial oxygen, the BMD density and the mean BMD radius. The dashed curve 7 denotes the temperature profile during production of the SOI wafer, the continuous curve 8 denotes the decimal logarithm of the BMD density.
Figure 4:
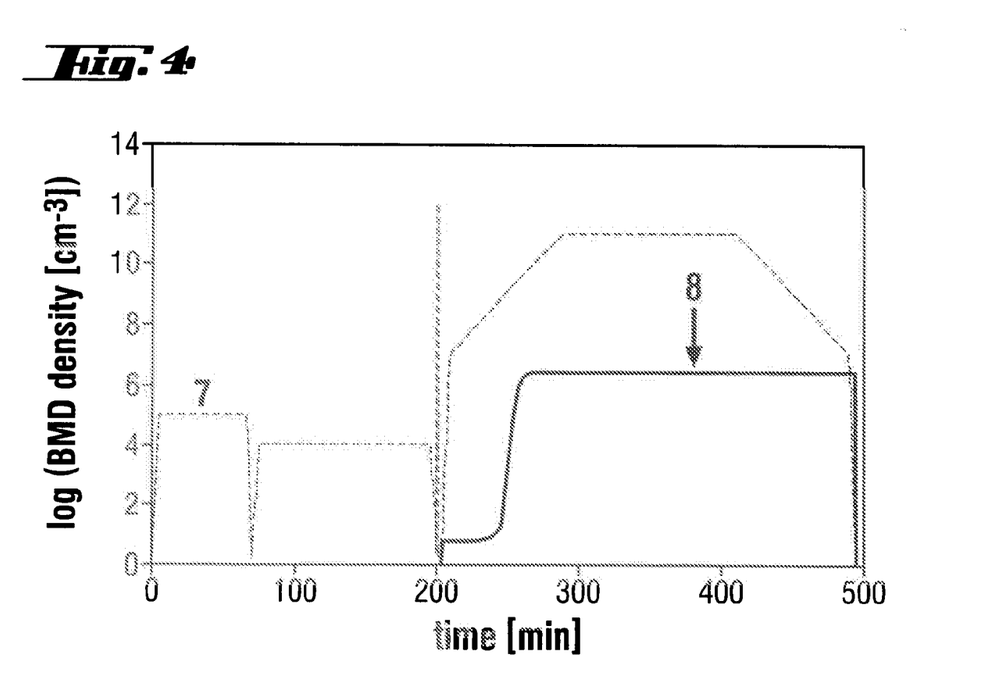
FIG. 4 shows the variables illustrated in FIG. 3 for the second process according to the invention, in which the heat treatment is carried out in two stages. The dashed curve 7 once again denotes the temperature profile during the production of the SOI wafer, and the continuous curve 8 denotes the decimal logarithm of the BMD density.

The SOI wafers referred to have a specific thermal history behind them, leading to a specific BMD formation. FIG. 1 shows a typical BMD distribution in prior art SOI wafer of this type. The distribution is highly inhomogeneous, with a relatively low BMD density in the vicinity of the wafer back surface 3 but a BMD density which is higher by a multiple in the vicinity of the wafer front surface 1. The wafer front surface bears the thin film of silicon which is intended for the fabrication of electronic components. Overall, the BMD density decreases from the wafer front surface 1 to the center of the wafer 2 and then decreases further toward the wafer back surface 3. By contrast, the distribution of the BMD density in a conventional CZ silicon wafer (FIG. 2), i.e. a silicon wafer without a layer structure produced from a silicon single crystal pulled using the Czochralski method, is relatively homogeneous and has a different profile: the BMD density decreases from the center of the wafer 5 both toward the wafer front surface 4 and toward the wafer back surface 6.

Furthermore, the SOI wafer has a layer structure which leads to layer stresses similar to those in wafers with an epitaxial layer, a polycrystalline silicon layer or a silicon oxide layer.

The combination of the two effects, namely the incorporated layer stresses and the inhomogeneous defect distribution, leads to a complicated behavior on the part of the global shape, which differs significantly from the behavior of conventional CZ silicon wafers.

The RTA treatment of the prior art is employed only in order to sufficiently smooth the surface of the transferred silicon layer, which has a certain roughness as a result of being separated from the remainder of the donor wafer. According to prior art, this RTA treatment has no further objectives (cf. EP1158581A1). It was therefore not obvious to solve the photolithography problem by modifying this RTA treatment in accordance with the thermal treatment regimens described herein.

EXAMPLES

Figure 5:
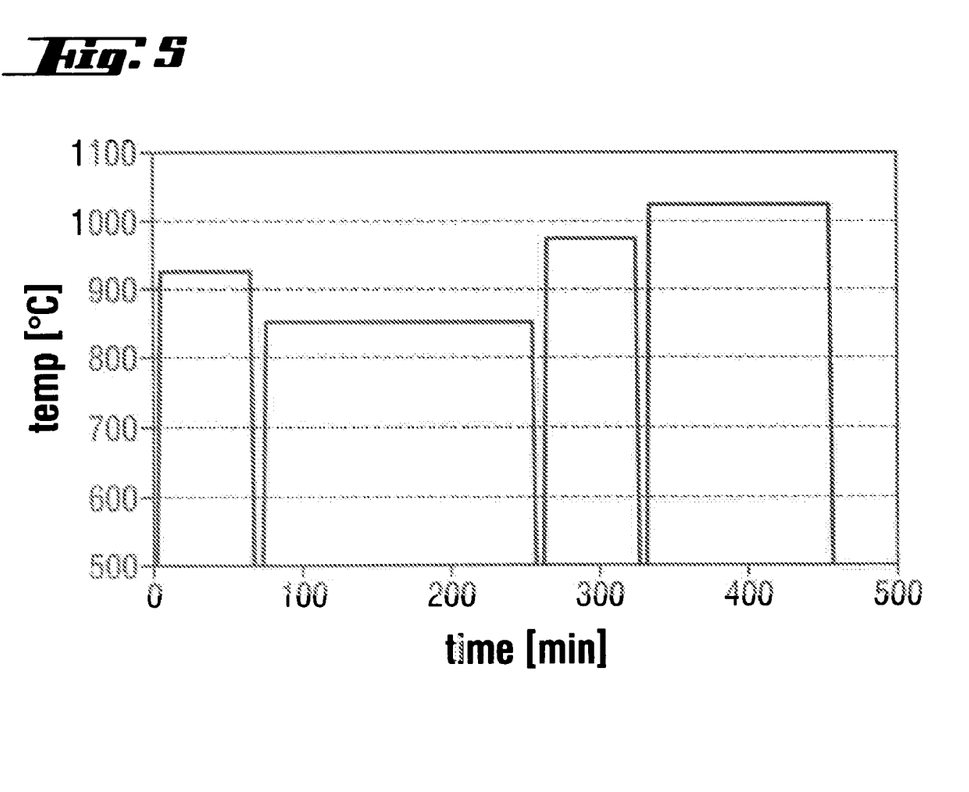
FIG. 5 shows the temperature profile of a modern component process as used in the examples.

In the following Examples and the Comparative Example, a total of nine layer transfer SOI wafers with a diameter of 300 mm (comprising a carrier wafer of single-crystal silicon, an insulating layer consisting of silicon oxide and a layer of silicon located thereon) were subjected to different RTA treatments. The BMD density and the warp were measured after the RTA treatment. The results are to be found in Table 1 in the columns headed "immediately after SOI process". After these measurements, the SOI wafers were subjected to a heat treatment with a temperature profile typical of the fabrication of modern electronic components. This temperature profile (in ° C.) is illustrated as a function of time (in minutes) in FIG. 5. Warp and BMD density were measured once again after this heat treatment. The results are to be found in Table 1 in the columns headed "after component processing".

TABLE 1

| Example | immediately after SOI process | | after component processing | |
|---|---|---|---|---|
| | BMD density [1 · 10$^6$/cm$^2$] | Warp [μm] | BMD density [1 · 10$^6$/cm$^2$] | Warp [μm] |
| C | 2.03 | 40.3 | 2.41 | 54.7 |
| 1A | 0.09 | 15.2 | 0.09 | 16.5 |
| 1B | 0.01 | 18.1 | 0.02 | 19.3 |
| 2A | 0.08 | 14.8 | 0.09 | 15.4 |
| 2B | 0.01 | 19.5 | 0.01 | 21.2 |
| 3A | 0.01 | 17.5 | 0.02 | 17.9 |
| 3B | 0.03 | 22.6 | 0.04 | 24.7 |
| 4A | 0.04 | 21.5 | 0.04 | 22.2 |
| 4B | 0.01 | 20.9 | 0.01 | 21.1 |

Comparative Example (C): The RTA treatment was carried out in a nitrogen atmosphere in accordance with prior art. The RTA treatment was carried out in a single stage at a heating rate of 100° C./s to 1,200° C. The SOI wafer was then held at this temperature for 10 s and then cooled to room temperature at a cooling rate of 100° C./s.

Example 1A

The RTA treatment was carried out in a nitrogen atmosphere in accordance with the first process according to the invention. The RTA treatment was carried out in a single stage at a heating rate of 100° C./s to 1,200° C. The SOI wafer was then held at this temperature for 10 s and then cooled to room temperature at a cooling rate of 15° C./s.

Example 1B

The RTA treatment was carried out in a nitrogen atmosphere in accordance with the first process according to the invention. The RTA treatment was carried out in a single stage at a heating rate of 100° C./s to 1,200° C. The SOI wafer was then held at this temperature for 10 s and then cooled to room temperature at a cooling rate of 5° C./s.

Example 2A

The RTA treatment was carried out in two stages in a nitrogen atmosphere in accordance with the second process according to the invention. The RTA treatment was carried out at a heating rate of 100° C./s to 1,200° C. The SOI wafer was then held at this temperature for 10 s and then cooled to 1,000° C. at a cooling rate of 100° C./s. The SOI wafer was then held at 1,000° C. for 90 s before being cooled to room temperature at a cooling rate of 100° C./s.

Example 2B

The RTA treatment was carried out in two stages in a nitrogen atmosphere in accordance with the second process according to the invention. The RTA treatment was carried out at a heating rate of 100° C./s to 1,200° C. The SOI wafer was then held at this temperature for 10 s and then cooled to 1,050° C. at a cooling rate of 100° C./s. The SOI wafer was then held at 1,050° C. for 240 s before being cooled to room temperature at a cooling rate of 100° C./s.

Example 3A

The RTA treatment was carried out in two stages in a nitrogen atmosphere in accordance with the third process according to the invention. The first stage of the RTA treatment was carried out at a heating rate of 100° C./s to 1,200° C. The SOI wafer was then held at this temperature for 10 s and then cooled to room temperature at a cooling rate of 100° C./s. The second stage of the RTA treatment was then carried out at a heating rate of 100° C./s to 1,100° C. The SOI wafer was then held at this temperature for 90 s before being cooled to room temperature at a cooling rate of 100° C./s.

Example 3B

The RTA treatment was carried out in two stages in a nitrogen atmosphere in accordance with the third process according to the invention. The first stage of the RTA treatment was carried out at a heating rate of 100° C./s to 1,200° C. The SOI wafer was then held at this temperature for 10 s and then cooled to room temperature at a cooling rate of 100° C./s. The second stage of the RTA treatment was then carried out at a heating rate of 100° C./s to 1,050° C. The SOI wafer was then held at this temperature for 60 s before being cooled to room temperature at a cooling rate of 100° C./s.

Example 4A

The RTA treatment was carried out in a nitrogen atmosphere with an oxygen content of 15,000 ppm in accordance with the fourth process according to the invention. The RTA treatment was carried out in a single stage at a heating rate of 100° C./s to 1,200° C. The SOI wafer was then held at this temperature for 10 s and then cooled to room temperature at a cooling rate of 100° C./s.

Example 4B

The RTA treatment was carried out in a nitrogen atmosphere with an oxygen content of 20,000 ppm in accordance with the fourth process according to the invention. The RTA treatment was carried out in a single stage at a heating rate of 100° C./s to 1,200° C. The SOI wafer was then held at this temperature for 10 s and then cooled to room temperature at a cooling rate of 100° C./s.

Table 1 shows that the SOI wafers which were heat-treated in accordance with Examples 1A to 4B have significantly lower BMD densities and warp values following this heat treatment than the SOI wafer of the Comparative Example. The BMD densities and warp values of the SOI wafers according to the invention are also virtually unchanged after the fabrication of electronic components. By contrast, both the BMD density and the warp increased considerably during component fabrication with the SOI wafer corresponding to the Comparative Example. The SOI wafers according to the invention produced by the process according to the invention therefore have both significantly lower warp values and DeltaWarp values than SOI wafers in accordance with prior art.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for producing a semiconductor wafer having improved global geometry, comprising providing a semiconductor wafer with a diameter of at least 200 mm comprising a silicon carrier wafer portion, an electrically insulating layer, and a semiconductor layer located thereon, the semiconductor wafer having been produced by means of a layer transfer process comprising at least one RTA step, wherein the semiconductor wafer has a warp of less than 30 μm, a DeltaWarp of less than 30 μm, a bow of less than 10 μm and a DeltaBow of less than 10 μm, and heat treating the semiconductor wafer, the process comprising heat treating by at least one of
   a) heat treating the semiconductor wafer at a heating rate of from 10 to 200° C./s to a temperature in the range from 1,100 to 1,250° C., holding the semiconductor wafer in this temperature range for a period of 5 s to 300 s, and cooling the semiconductor wafer at a cooling rate of from 0.5 to 25° C./s, or
   b) heat treating the semiconductor wafer at a heating rate of from 10 to 200° C./s to a temperature in a first temperature range of from 1,100 to 1,250° C.; holding the semiconductor wafer in the first temperature range for a first period of 5 s to 300 s; cooling the semiconductor wafer at a first cooling rate of from 10 to 150° C./s until the temperature is in a second temperature range of from 1,000 to 1,150° C., the temperature in the second temperature range being lower than the temperature in the first temperature range; holding the semiconductor wafer in the second temperature range for a second period of 10 s to 300 s;, and cooling the semiconductor wafer at a second cooling rate of from 10 to 150° C./s, or
   c) heat treating the semiconductor wafer in a first heat treatment in which the semiconductor wafer is heated at a first heating rate of from 10 to 200° C./s to a temperature in a first temperature range of from 1,100 to 1,250° C., holding the semiconductor wafer in the first temperature range for a first period of 5 s to 300 s, cooing the semiconductor wafer at a first cooling rate of from 10 to 150° C./s, and heat treating the semiconductor wafer in a second heat treatment in which the semiconductor wafer is heated at a second heating rate of from 10 to 200° C./s until the temperature has reached a value in a second temperature range of from 1,000 to 1,150° C., holding the semiconductor wafer in the second temperature range for a second period of 10 s to 300 s, and cooling the semiconductor wafer at a second cooling rate of from 10 to 150° C./s, or
   d) heat treating the semiconductor wafer in a heat treatment in an atmosphere which contains more than 12,000 ppm of oxygen, in which the semiconductor wafer is heated at a heating rate of from 10 to 200° C. until the temperature has reached a value in the range from 1,100 to 1,250° C., holding the semiconductor wafer in this temperature range for a period of 5 s to 300 s, and cooling the semiconductor wafer at a cooling rate of from 10 to 150° C./s.

2. The process of claim 1, comprising heat treating the semiconductor wafer at a heating rate of from 10 to 200° C./s to a temperature in the range from 1,100 to 1,250° C., holding the semiconductor wafer in this temperature range for a period of 5 s to 300 s, and cooling the semiconductor wafer at a cooling rate of from 0.5 to 25° C./s.

3. The process of claim 2, in which the cooling rate is from 0.5 to 15° C./s.

4. The process of claim 2, wherein the warp is less than 20 μm, the DeltaWarp is less than 5 μm, the bow is less than 10 μm, and the DeltaBow is less than 5 μm.

5. The process of claim 2, wherein the carrier wafer, following heat treating of the semiconductor wafer, has a BMD density of less than $1 \times 10^6/cm^2$ and a uniform BMD density such that the BMD density throughout the wafer differs by no more than 50% of the mean BMD density throughout the entire volume of the wafer.

6. The process of claim 1, heat treating the semiconductor wafer at a heating rate of from 10 to 200° C./s to a temperature in a first temperature range of from 1,100 to 1,250° C.; holding the semiconductor wafer in the first temperature range for a first period of 5 s to 300 s; cooling the semiconductor wafer at a first cooling rate of from 10 to 150° C./s until the temperature is in a second temperature range of from 1,000 to 1,150° C., the temperature in the second temperature range being lower than the temperature in the first temperature range; holding the semiconductor wafer in the second temperature range for a second period of 10 s to 300 s;, and cooling the semiconductor wafer at a second cooling rate of from 10 to 150° C./s.

7. The process of claim 6, wherein the duration of the second period is from 30 s to 120 s.

8. The process of claim 6, wherein the warp is less than 20 μm, the DeltaWarp is less than 5 μm, the bow is less than 10 μm, and the DeltaBow is less than 5 μm.

9. The process of claim 6, wherein the carrier wafer, following heat treating of the semiconductor wafer, has a BMD density of less than $1 \times 10^6/cm^1$ and a uniform BMD density such that the BMD density throughout the wafer differs by no more than 50% of the mean BMD density throughout the entire volume of the wafer.

10. The process of claim 1, comprising heat treating the semiconductor wafer in a first heat treatment in which the semiconductor wafer is heated at a first heating rate of from 10 to 200° C./s to a temperature in a first temperature range of from 1,100 to 1,250° C., holding the semiconductor wafer in the first temperature range for a first period of 5 s to 300 s, cooing the semiconductor wafer at a first cooling rate of from 10 to 150° C./s, and heat treating the semiconductor wafer in a second heat treatment in which the semiconductor wafer is heated at a second heating rate of from 10 to 200° C./s until the temperature has reached a value in a second temperature range of from 1,000 to 1,150° C., holding the semiconductor wafer in the second temperature range for a second period of 10 s to 300 s, and cooling the semiconductor wafer at a second cooling rate of from 10 to 150° C./s.

11. The process of claim 10, wherein the warp is less than 20 µm, the DeltaWarp is less than 5 µm, the bow is less than 10 µm, and the DeltaBow is less than 5 µm.

12. The process of claim 10, wherein the carrier wafer, following heat treating of the semiconductor wafer, has a BMD density of less than $1 \times 10^6/cm^2$ and a uniform BMD density such that the BMD density throughout the wafer differs by no more than 50% of the mean BMD density throughout the entire volume of the wafer.

13. The process of claim 1, comprising heat treating the semiconductor wafer in a heat treatment in an atmosphere which contains more than 12,000 ppm of oxygen, in which the semiconductor wafer is heated at a heating rate of from 10 to 200° C. until the temperature has reached a value in the range from 1,100 to 1,250° C., holding the semiconductor wafer in this temperature range for a period of 5 s to 300 s, and cooling the semiconductor wafer at a cooling rate of from 10 to 150° C./s.

14. The process as claimed in claim 13, wherein the atmosphere contains at least 20,000 ppm of oxygen.

15. The process of claim 13, wherein the warp is less than 20 µm, the DeltaWarp is less than 5 µm, the bow is less than 10 µm, and the DeltaBow is less than 5 µm.

16. The process of claim 13, wherein the carrier wafer, following heat treating of the semiconductor wafer, has a BMD density of less than $1 \times 10^6/cm^2$ and a uniform BMD density such that the BMD density throughout the wafer differs by no more than 50% of the mean BMD density throughout the entire volume of the wafer.

17. The process of claim 1, wherein the carrier wafer, has a BMD density of less than $1 \times 10^5/cm^2$.

18. The process of claim 17, wherein the carrier wafer has an interstitial oxygen concentration in the range of $3 \times 10^{17}/cm^3$ and $8 \times 10^{17}/cm^3$.

19. The process of claim 17, wherein the carrier wafer has an interstitial oxygen concentration in the range of $5 \times 10^{17}/cm^3$ and $7 \times 10^{17}/cm^3$.

20. The process of claim 18, wherein the carrier wafer has a nitrogen concentration in the range from $5 \times 10^{14}/cm^3$ to $5 \times 10^{15}/cm^3$.

* * * * *

UNITED STATES PATENT AND TRADEMARK OFFICE
CERTIFICATE OF CORRECTION

PATENT NO. : 7,820,549 B2
APPLICATION NO. : 12/023102
DATED : October 26, 2010
INVENTOR(S) : Markus Blietz et al.

Page 1 of 1

It is certified that error appears in the above-identified patent and that said Letters Patent is hereby corrected as shown below:

Column 9, Line 63, Claim 1:

Delete "cooing" and insert -- cooling --.

Column 10, Line 62, Claim 10:

Delete "cooing" and insert -- cooling --.

Signed and Sealed this
Twenty-eighth Day of December, 2010

David J. Kappos
*Director of the United States Patent and Trademark Office*